United States Patent
Iizuka et al.

(10) Patent No.: US 10,497,539 B2
(45) Date of Patent: Dec. 3, 2019

(54) MULTI CHARGED PARTICLE BEAM WRITING APPARATUS AND MULTI CHARGED PARTICLE BEAM WRITING METHOD

(71) Applicant: NuFlare Technology, Inc., Yokohama-shi (JP)

(72) Inventors: Osamu Iizuka, Yokohama (JP); Yukitaka Shimizu, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 72 days.

(21) Appl. No.: 15/806,872

(22) Filed: Nov. 8, 2017

(65) Prior Publication Data
US 2018/0144905 A1    May 24, 2018

(30) Foreign Application Priority Data
Nov. 18, 2016  (JP) .................... 2016-225166

(51) Int. Cl.
*H01J 37/00*   (2006.01)
*H01J 37/302*  (2006.01)
(Continued)

(52) U.S. Cl.
CPC .......... *H01J 37/302* (2013.01); *H01J 37/045* (2013.01); *H01J 37/10* (2013.01); *H01J 37/147* (2013.01);
(Continued)

(58) Field of Classification Search
CPC ...... H01J 37/3177; H01J 37/20; H01J 37/244; H01J 37/3023; H01J 37/045; H01J 37/147;
(Continued)

(56) References Cited

U.S. PATENT DOCUMENTS 7,034,321 B2 *  4/2006  Takakuwa .............. B82Y 10/00
                                                250/397
9,082,588 B2 *  7/2015  Matsumoto ......... H01J 37/3177
(Continued)

FOREIGN PATENT DOCUMENTS

JP    10-261556 A    9/1998
JP    10-261566 A    9/1998
(Continued)

OTHER PUBLICATIONS

Korean Office Action dated Mar. 20, 2019 in Patent Application No. 10-2017-0154677, 9 pages (with unedited computer generated English translation).
(Continued)

*Primary Examiner* — Michael Maskell
(74) *Attorney, Agent, or Firm* — Oblon, McClelland, Maier & Neustadt, L.L.P.

(57) ABSTRACT

According to one embodiment, a multi charged particle beam writing apparatus includes an objective lens adjusting a focus position of multiple beams, a coil correcting astigmatism of the multiple beams, an inspection aperture disposed in a stage and configured to allow one beam of the multiple beams to pass therethrough, a deflector deflecting the multiple beams, a current detector detecting a beam current of each beam of the multiple beams scanned over the inspection aperture in the XY direction and passed through the inspection aperture, and a controller generating a beam image on the basis of the detected beam current, calculating a feature quantity of the beam image, and controlling the objective lens or the coil on the basis of the feature quantity.

18 Claims, 8 Drawing Sheets

(51) Int. Cl.
  *H01J 37/04* (2006.01)
  *H01J 37/10* (2006.01)
  *H01J 37/147* (2006.01)
  *H01J 37/153* (2006.01)
  *H01J 37/20* (2006.01)
  *H01J 37/244* (2006.01)
  *H01J 37/317* (2006.01)
  *H01J 37/304* (2006.01)

(52) U.S. Cl.
  CPC ............ *H01J 37/153* (2013.01); *H01J 37/20* (2013.01); *H01J 37/244* (2013.01); *H01J 37/304* (2013.01); *H01J 37/3177* (2013.01); *H01J 2237/0435* (2013.01); *H01J 2237/0453* (2013.01); *H01J 2237/1532* (2013.01); *H01J 2237/20221* (2013.01); *H01J 2237/21* (2013.01); *H01J 2237/24514* (2013.01); *H01J 2237/24564* (2013.01); *H01J 2237/24592* (2013.01); *H01J 2237/31774* (2013.01); *H01J 2237/31798* (2013.01)

(58) Field of Classification Search
  CPC ....... H01J 2237/0435; H01J 2237/0453; H01J 2237/24564; H01J 2237/24592; H01J 2237/31774; H01J 2237/31798
  USPC ............ 250/306, 307, 310, 311, 396 R–398
  See application file for complete search history.

(56) References Cited

U.S. PATENT DOCUMENTS

2004/0135102 A1* 7/2004 Muraki .................. B82Y 10/00
                                                    250/492.22
2014/0065547 A1* 3/2014 Arita .................. H01J 37/3177
                                                    430/296

FOREIGN PATENT DOCUMENTS

| JP | 2005-147671   | 6/2005  |
| JP | 2006-79911 A  | 3/2006  |
| JP | 2006-80304    | 3/2006  |
| JP | 2006-287013   | 10/2006 |
| JP | 2015-228501   | 12/2015 |
| JP | 2016-134486   | 7/2016  |

OTHER PUBLICATIONS

Combined Taiwanese Office Action and Search Report dated Mar. 7, 2019 in Patent Application No. 106134336 (with partial English translation and English translation of categories of cited documents), 14 pages.

* cited by examiner

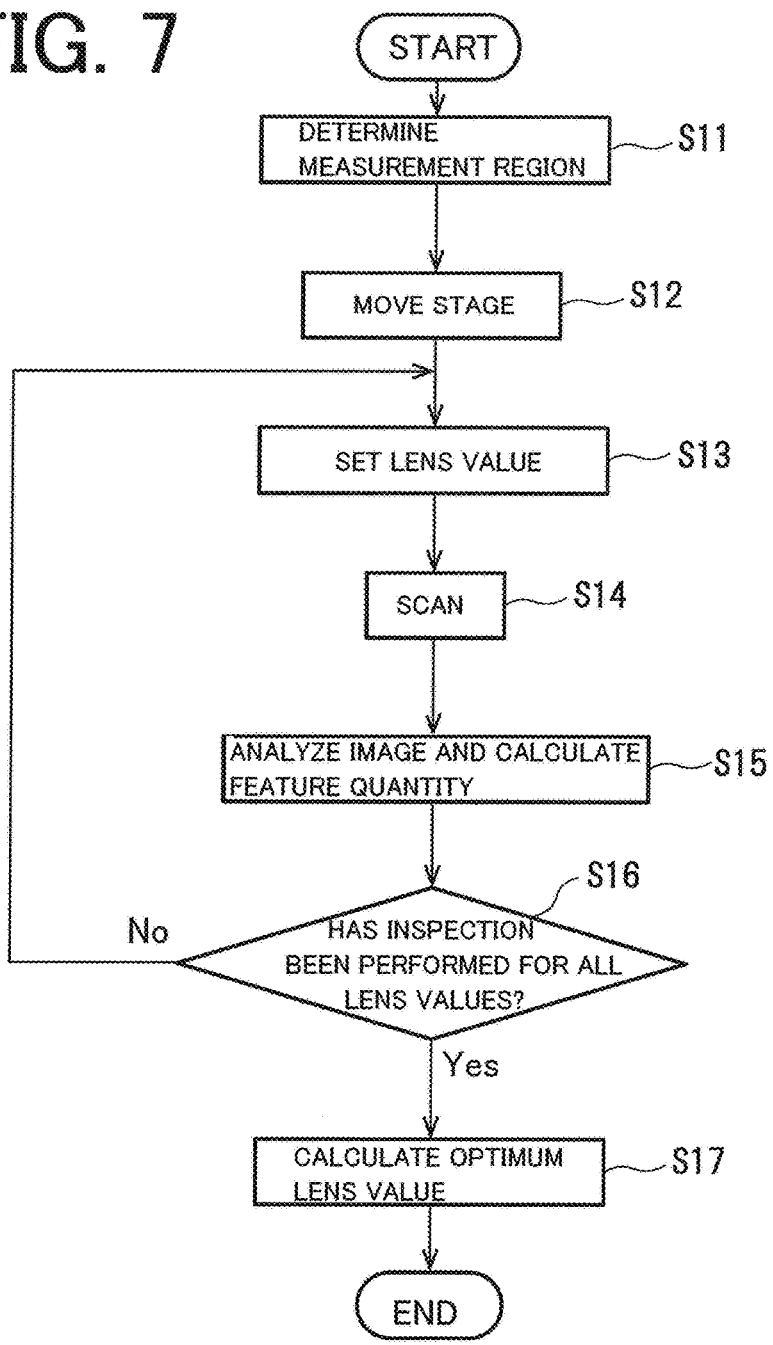

LENS VALUE

LUMINANCE VARIANCE

LENS VALUE

OPTIMUM LENS VALUE

MULTI CHARGED PARTICLE BEAM WRITING APPARATUS AND MULTI CHARGED PARTICLE BEAM WRITING METHOD

CROSS REFERENCE TO RELATED APPLICATION

This application is based upon and claims benefit of priority from the Japanese Patent Application No. 2016-225166, filed on Nov. 18, 2016, the entire contents of which are incorporated herein by reference.

FIELD

The present invention relates to a multi charged particle beam writing apparatus and a multi charged particle beam writing method.

BACKGROUND

As LSI circuits are increasing in density, the line width of circuits of semiconductor devices is becoming finer. Examples of methods of producing an exposure mask (also called a reticle that is used in a stepper or a scanner) to be used to form a circuit pattern for such a semiconductor device include an electron beam writing technique with high resolution.

As electron beam writing apparatuses, writing apparatuses using multiple beams have been developed as an alternative to conventional, single beam writing apparatuses that deflect a single beam to irradiate a desired area of a substrate with the beam. Using multiple beams can significantly improve throughput, because more beams than in the case of writing with a single electron beam can be applied. For example, a multi-beam writing apparatus allows an electron beam emitted from an electron gun to pass through an aperture member having a plurality of holes to form multiple beams, each of which is blanking-controlled by a blanking aperture array. Then, beams that have not been blocked are reduced by an optical system and applied to a substrate on a movable stage.

For multi-beam writing, adjustment, such as focusing, of an optical system is important. Conventionally, by scanning a linear reflective mark on a stage to detect reflected electrons while varying the focus position with an objective lens, focusing has been performed on the basis of a profile acquired at each focus position. The reflective mark needs to be scanned orthogonally to the direction in which the linear reflective mark extends. When the focus position is shifted by the objective lens, the shape of the entire multi-beam image on the substrate is rotated. Therefore, conventionally, the rotation of the entire multi-beam image has been cancelled by making the outputs of two objective lenses in conjunction with each other on the basis of a correlation coefficient. However, this requires calculating the correlation coefficient between the two objective lenses in advance.

Multiple beams include many beams (e.g., about 260000 beams). Therefore, it has been extremely difficult to manufacture the aperture member that forms the multiple beams and the blanking aperture array that controls the blanking of each beam without creating any defects at all. Defects of the aperture member or blanking aperture array may cause unintended beams to reach the substrate, or may block desired beams from reaching the substrate. With the conventional technique which involves scanning a reflective mark, such defects may lower the SN ratio.

BRIEF DESCRIPTION OF THE DRAWINGS

FIG. 7 is a flowchart illustrating a focusing method according to the embodiment.

DETAILED DESCRIPTION

According to one embodiment, a multi charged particle beam writing apparatus includes an objective lens adjusting a focus position of multiple beams, a coil correcting astigmatism of the multiple beams, an inspection aperture disposed in a stage and configured to allow one beam of the multiple beams to pass therethrough, a deflector deflecting the multiple beams, a current detector detecting a beam current of each beam of the multiple beams scanned over the inspection aperture in the XY direction and passed through the inspection aperture, and a controller generating a beam image on the basis of the detected beam current, calculating a feature quantity of the beam image, and controlling the objective lens or the coil on the basis of the feature quantity.

Embodiments of the present invention will be described with reference to the drawings.

Figure 1:
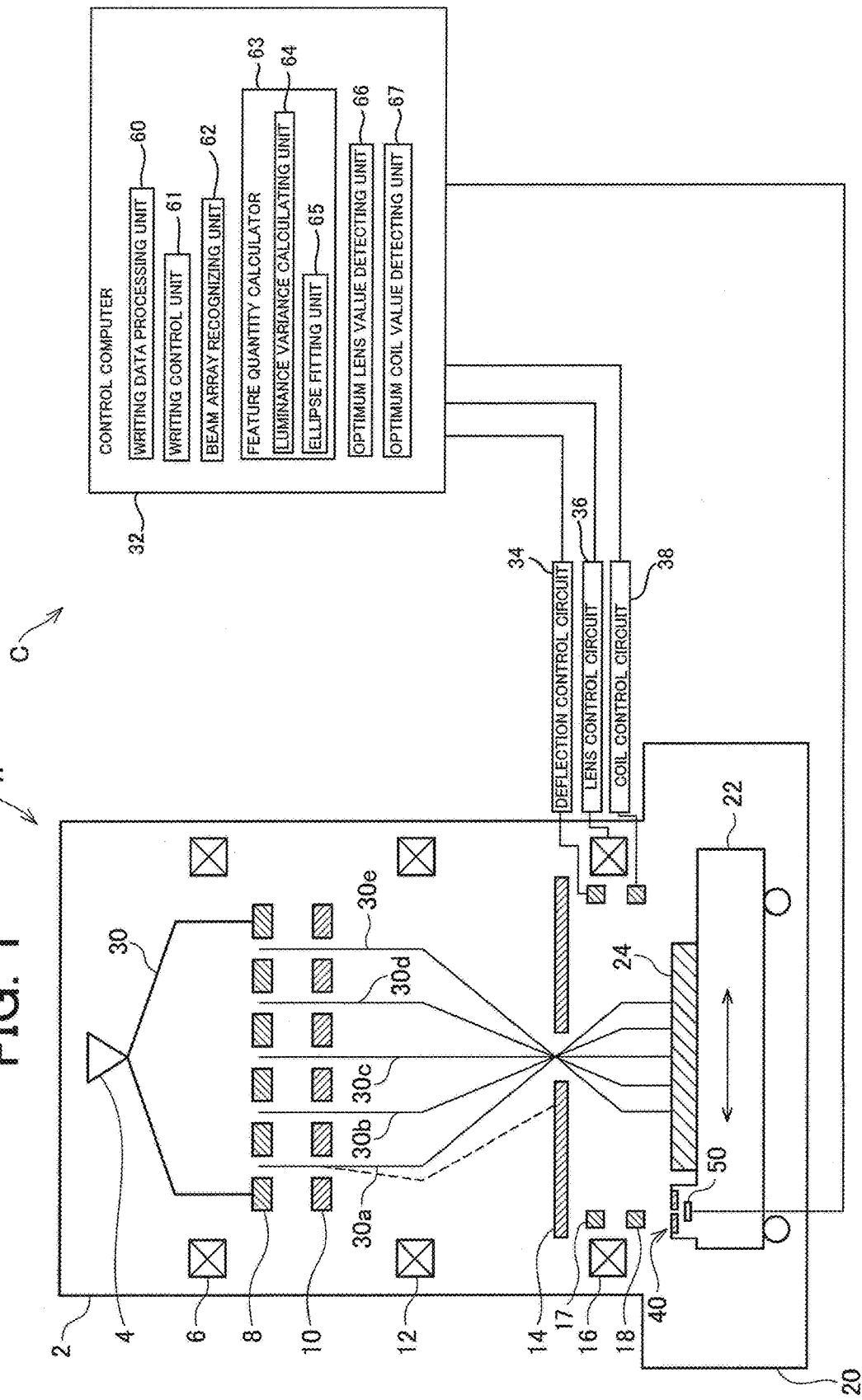
FIG. 1 is a schematic diagram of a multi charged particle beam writing apparatus according to an embodiment of the present invention.

FIG. 1 is a schematic diagram of a multi charged particle beam writing apparatus according to an embodiment of the present invention. The present embodiment will describe a configuration that uses an electron beam as a charged particle beam. Note, however, that the charged particle beam is not limited to an electron beam, and may be another beam using charged particles, such as an ion beam.

The writing apparatus includes a writer W that applies electron beams to a substrate 24, which serves as a writing target, to write a desired pattern thereon, and a controller C that controls the operation of the writer W.

The writer W includes an electron beam barrel 2 and a writing chamber 20. The electron beam barrel 2 includes an electron gun 4, an illuminating lens 6, an aperture member 8 (an aperture plate), a blanking aperture array 10, a reducing lens 12, a limiting aperture member 14, an objective lens 16, a deflector 17, and an astigmatism correction coil 18.

An XY stage 22 is disposed in the writing chamber 20. The substrate 24 (writing target) is placed on the XY stage 22. Examples of the substrate 24 (writing target) include a wafer, and an exposure mask for transferring a pattern to a wafer using a step-and-repeat exposure system or extreme ultraviolet (EUV) exposure system, such as a stepper or scanner, which uses an excimer laser as a light source.

The XY stage 22 includes, at a position different from the position of the substrate 24, a multi-beam inspecting device having a multi-beam inspection aperture 40 (hereinafter referred to as "inspection aperture 40") and a current detector 50. The height of the inspection aperture 40 can be adjusted by an adjusting mechanism (not shown). The inspection aperture 40 is preferably disposed at the same height as the substrate 24.

The controller C includes a control computer 32, a deflection control circuit 34, a lens control circuit 36, and a coil control circuit 38. The deflection control circuit 34 is connected to the deflector 17. The lens control circuit 36 is connected to the objective lens 16. The coil control circuit 38 is connected to the astigmatism correction coil 18.

The control computer 32 includes a writing data processing unit 60, a writing control unit 61, a beam array recognizing unit 62, a feature quantity calculator 63, an optimum-lens-value detecting unit 66, and an optimum-coil-value detecting unit 67. The feature quantity calculator 63 includes a luminance variance calculating unit 64 and an ellipse fitting unit 65. The components of the control computer 32 may be configured either by hardware, such as an electric circuit, or by software, such as a program that executes their functions. When configured by software, a program that implements the functions described above may be stored in a recording medium and executed by having a computer including an electric circuit read it.

The writing data processing unit 60 reads writing data from a storage device (not shown), and performs multiple stages of data conversion processing to generate shot data. The shot data is generated for each pixel, and writing time (irradiation time) is computed. For example, when no pattern is to be formed in a target pixel, an identification code indicating "zero writing time" or "no beam irradiation" is defined, because no beam irradiation is to be made. Here, a maximum writing time T (maximum exposure time) for one multi-beam shot is set in advance. The irradiation time of each beam to be actually emitted is preferably determined in proportion to the calculated area density of a pattern. The irradiation time of each beam eventually calculated is preferably a time period that corresponds to a dose (amount of irradiation) obtained by correcting, with a dose, the amount of dimensional change resulting from phenomena (not shown), such as a proximity effect, a fogging effect, and a loading effect, that cause dimensional changes. Therefore, the irradiation time of each beam to be actually emitted may vary. The writing time (irradiation time) of each beam is computed to be a value within the maximum writing time T. The writing data processing unit 60 generates irradiation time array data in which the irradiation time data computed for each pixel is arranged, for each multi-beam shot, as data for beams to be used for writing the pixel, in the sequence of beams of multiple beams.

The deflection control circuit 34 uses the irradiation time array data (shot data) to generate deflection data that represents the amount of deflection of the multiple beams. The writing control unit 61 outputs, to the deflection control circuit 34 and a control circuit (not shown) that drives the writer W, a control signal for performing writing processing. On the basis of the control signal, the writer W writes a desired pattern on the substrate 24 using the multiple beams. Specifically, the writer W operates in the following manner.

Figure 2:
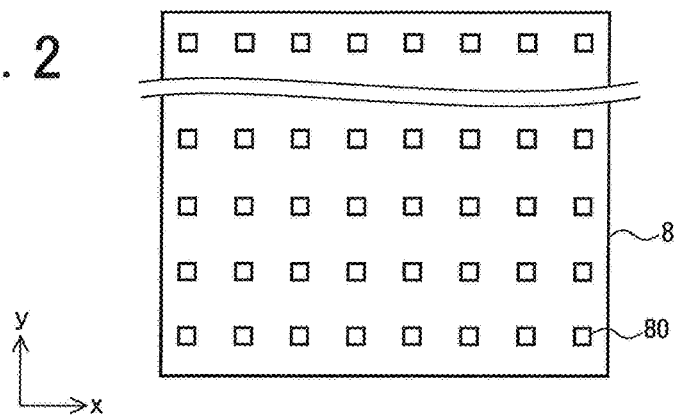
FIG. 2 is a schematic diagram of an aperture member.

An electron beam 30 emitted from the electron gun 4 is substantially perpendicularly applied by the illuminating lens 6 to the entire aperture member 8. FIG. 2 is a conceptual diagram illustrating a configuration of the aperture member 8. The aperture member 8 has holes (opening portions) 80 arranged in a matrix of m columns (in the y direction) and n rows (in the x direction) with a predetermined array pitch, where both m and n are greater than or equal to 2 (m, n≥2). For example, the aperture member 8 has 512 columns by 512 rows of holes 80. The holes 80 are rectangular holes of the same size and shape. The holes 80 may be circular holes of the same diameter.

The electron beam 30 illuminates a region including all the holes 80 of the aperture member 8. Multiple beams 30a to 30e illustrated in FIG. 1 are formed by allowing parts of the electron beam 30 to pass through the respective holes 80.

The blanking aperture array 10 has through holes arranged to coincide with the respective holes 80 of the aperture member 8, and each of the through holes is provided with a blanker composed of two electrodes forming a pair. The electron beams 30a to 30e passing through the respective through holes are independently deflected by voltages applied thereto by the corresponding blankers. Each beam is thus blanking-controlled by the deflection. The blanking aperture array 10 performs blanking deflection of each beam of the multiple beams passed through the holes 80 of the aperture member 8.

The multiple beams 30a to 30e passed through the blanking aperture array 10 are reduced in size and array pitch by the reducing lens 12, and travel toward the center hole of the limiting aperture member 14. Electron beams deflected by the blankers of the blanking aperture array 10 change their paths, deviate from the center hole of the limiting aperture member 14, and are blocked by the limiting aperture member 14. On the other hand, electron beams that are not deflected by the blankers of the blanking aperture array 10 pass through the center hole of the limiting aperture member 14.

The limiting aperture member 14 blocks each electron beam that has been deflected by the corresponding blanker of the blanking aperture array 10 such that the beam is turned off. Beams that have passed through the limiting aperture member 14 after being turned on and before being turned off serve as electron beams of one shot.

The electron beams 30a to 30e passed through the limiting aperture member 14 are converged by the objective lens 16 to form a pattern image with a desired reduction ratio on the substrate 24. The electron beams (all the multiple beams) passed through the limiting aperture member 14 are deflected together in the same direction by the deflector 17 and applied to the substrate 24.

The multiple beams applied at a time are ideally arranged with a pitch that is obtained by multiplying the array pitch of the holes 80 in the aperture member 8 by the desired reduction ratio described above. When this writing apparatus performs a writing operation with a raster scanning technique, which involves continuous and sequential application of shot beams, to write a desired pattern, beams that are required to form the pattern are controlled to be turned on by blanking control. During continuous movement of the XY stage 22, the beam irradiation position is controlled by the deflector 17 to follow the movement of the XY stage 22.

To improve writing accuracy, the writing apparatus needs not only to adjust the optical system to set an optimum focus position, but also to correct astigmatism. In the present embodiment, the multi-beam inspecting device including the inspection aperture 40 and the current detector 50 is used to inspect beams and adjust the optical system.

Figure 3:
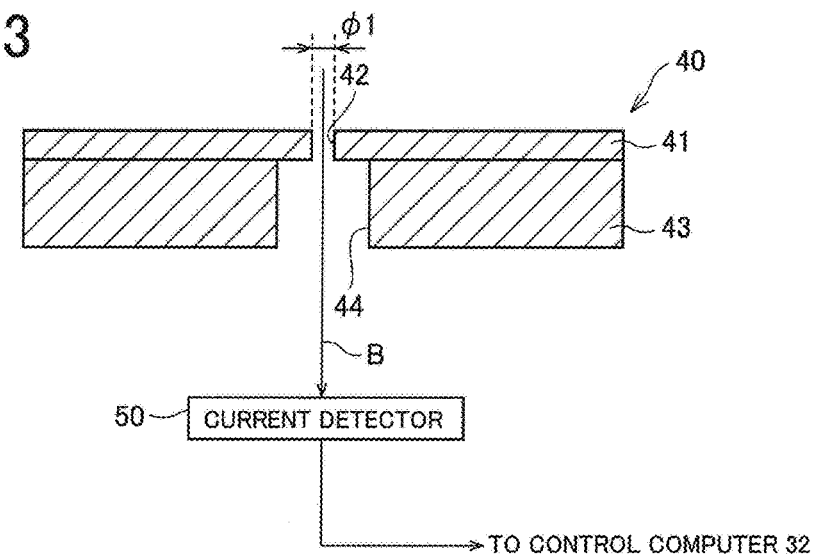
FIG. 3 is a schematic diagram of a beam inspecting unit according to the embodiment.
Figure 4:
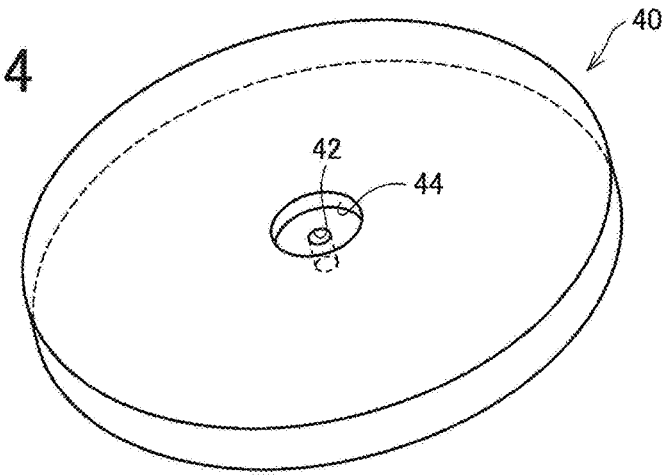
FIG. 4 is a perspective view of a multi-beam inspection aperture according to the embodiment.
Figure 5:
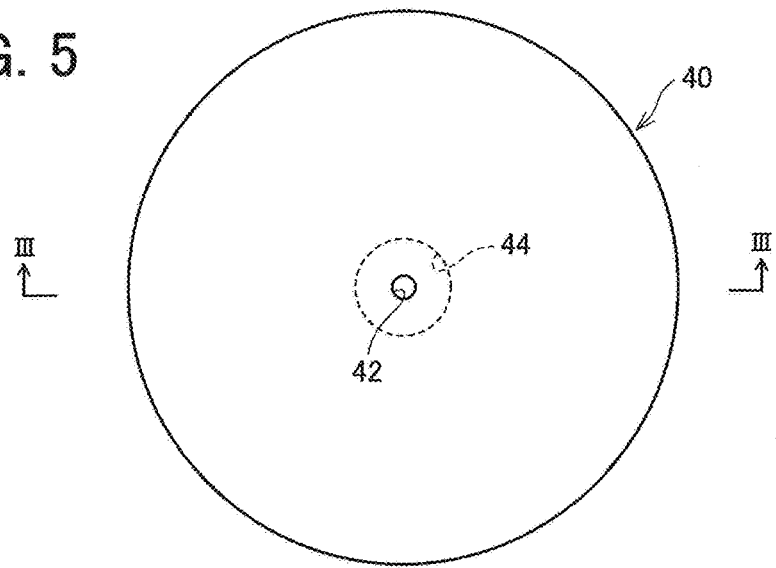
FIG. 5 is a plan view of the multi-beam inspection aperture according to the embodiment.

A configuration of the multi-beam inspecting device will be described with reference to FIGS. 3 to 5. FIG. 3 is a schematic configuration diagram of the multiple-beam beam inspecting device. FIG. 4 is a perspective view of the inspection aperture 40 as viewed from the lower side. FIG. 5 is a plan view of the inspection aperture 40 as viewed from the upper side. Note that FIG. 3 is a cross-sectional end view of the inspection aperture 40 taken along line III-III of FIG. 5.

The inspection aperture 40 is configured to restrict passage therethrough to only one electron beam. For example, the inspection aperture 40 composed of a scattering layer 41 and an absorbing layer 43 can be used. The scattering layer 41 is disposed on the absorbing layer 43. The inspection aperture 40 is, for example, a circular planar aperture having a through hole along the central axis thereof. The through hole includes an opening portion 44 formed in the center of the absorbing layer 43, and a through hole 42 formed in the center of the scattering layer 41 and continuing to the opening portion 44.

To make the inspection aperture 40, for example, a thin film of heavy metal having a high stopping power, such as Pt or W, is prepared, and the opening portion 44 is formed on the lower side by etching using a focused ion beam (FIB). Next, by etching using an FIB, the through hole 42 with a smaller diameter than the opening portion 44 is formed at the bottom of the opening portion 44. A portion of the thin heavy metal film having the opening portion 44 corresponds to the absorbing layer 43, and the other portion of the thin heavy metal film having the through hole 42 corresponds to the scattering layer 41. The processing sequence is not limited to this.

A diameter $\phi 1$ of the through hole 42 preferably satisfies $S<\phi 1<P-S$, where P is the beam pitch of multiple beams on the substrate 24 and S is the size of a single beam. If the diameter $\phi 1$ is greater than the beam size S, the single electron beam can entirely pass through the through hole 42 (non-scattering transmission) and the S/N ratio can be increased. The diameter $\phi 1$ is preferably as large as possible. This is to allow a beam to be easily found, and prevent the hole from being obstructed by foreign matter.

On the other hand, if the diameter $\phi 1$ is smaller than P−S, two adjacent beams (or part of them) do not simultaneously pass through the through hole 42 during scanning of multiple beams. The through hole 42 thus allows only one electron beam of the multiple beams to pass therethrough. For example, as illustrated in FIG. 6, when an electron beam B1 passes through the through hole 42, electron beams B2 adjacent to the electron beam B1 do not overlap the through hole 42.

Figure 6:
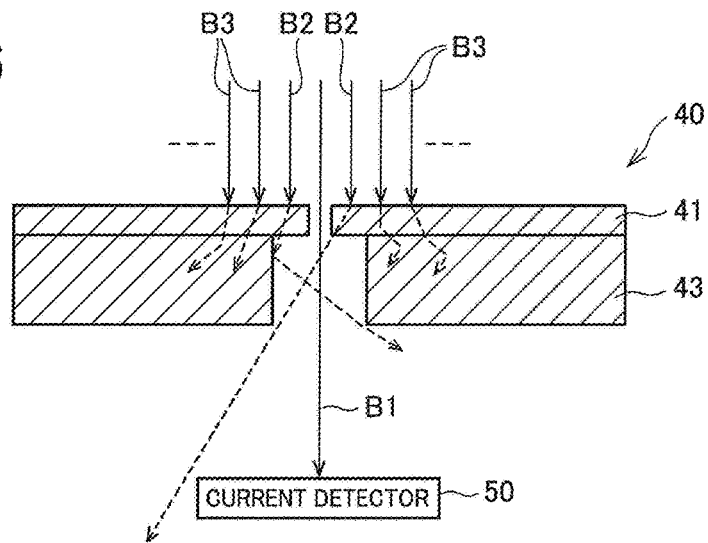
FIG. 6 illustrates multiple beams applied to the inspection aperture.

For example, as illustrated in FIG. 6, when the electron beam B1 passes through the through hole 42, the electron beams B2 immediately adjacent to the electron beam B1 (i.e., eight electron beams B2 around the electron beam B1) are applied to the scattering layer 41 and partially reflected on the surface of the scattering layer 41, but mostly enter the scattering layer 41 and are scattered as indicated by broken lines. The scattered electrons pass through the scattering layer 41, partially travel in a straight line in a vacuum, partially reflect on the surface of the absorbing layer 43, partially enter the absorbing layer 43, and (mostly) do not reach the current detector 50. Electron beams B3 adjacent to the electron beam B1, with one or more electron beams therebetween, are scattered by the scattering layer 41. The scattered electrons enter the absorbing layer 43 and are absorbed.

The structure of the inspection aperture 40 is not limited to that described above. Any structure is applicable as long as it is capable of restricting the passage therethrough to only one electron beam.

The electron beam passed through the through hole 42 and the opening portion 44 (i.e., the electron beam B in FIG. 3, the electron beam B1 in FIG. 6) enters the current detector 50, which detects a beam current. For example, a solid-state detector (SSD) can be used as the current detector 50. A result of detection made by the current detector 50 is sent to the control computer 32.

With reference to the flowchart of FIG. 7, a technique which determines an optimum focus position to achieve focusing is described.

In the present embodiment, a part of the blanking aperture array 10 is used as a measurement region to perform an inspection (or to scan the inspection aperture 40). This is because the maximum amount of deflection made by the deflector 17 used for beam scanning is not large enough to cover the entire region of the blanking aperture array 10. Therefore, first a measurement region (beam-on region) in the blanking aperture array 10 is determined (step S11).

The XY stage 22 is moved to position the inspection aperture 40 such that beams in the measurement region can be applied to the inspection aperture 40 (step S12).

The lens control circuit 36 changes or sets an excitation current value (lens value) of the objective lens 16 (step S13). As described below, any of a plurality of values within a preset range is variably set as the lens value. When the lens value changes, the focus position changes.

A plurality of beams turned on by blankers in the measurement region are deflected by the deflector 17 in the XY direction to scan the inspection aperture 40, and electron beams passed through the through hole 42 are sequentially switched (step S14). The current detector 50 detects a beam current.

Figure 8A:
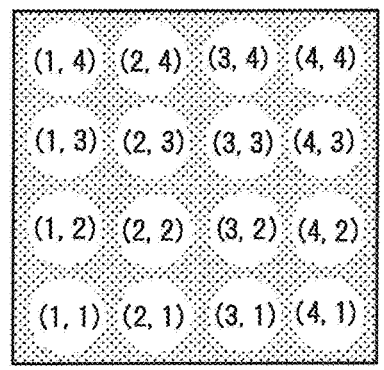
FIG. 8A illustrates a beam image.

The control computer 32 converts the beam current detected by the current detector 50 into luminance, generates a beam image on the basis of the amount of deflection made by the deflector 17, and performs image analysis (step S15). For example, a beam image such as that illustrated in FIG. 8A is generated. This is an exemplary image obtained when an inspection region is a four by four array, with (1, 1) at the lower left.

Figure 8B:
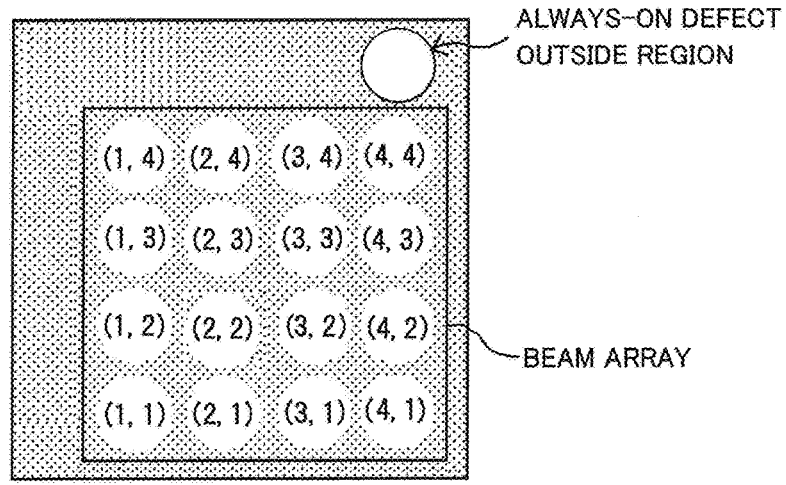
FIG. 8B illustrates an example of beam array recognition processing.

FIG. 8B illustrates an image showing that there is an "always-on" defect in the vicinity of the measurement region. The beam array recognizing unit 62 recognizes a beam array region corresponding to the measurement region, and defects outside the region are ignored. For example, since the inspection region is determined to be a four by four array in advance, the beam array recognizing unit 62 recognizes the beam array such that the number of beams included in the region of the four by four array size is maximized.

Then, the feature quantity calculator 63 calculates a feature quantity of the beam image. Specifically, the luminance variance calculating unit 64 calculates a luminance variance as the feature quantity of the beam image.

Figure 9:
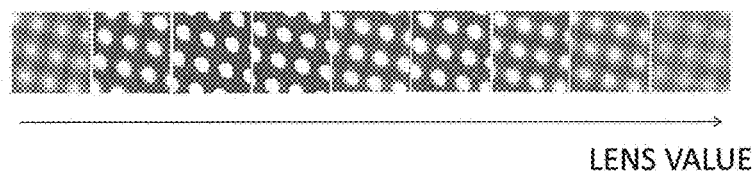
FIG. 9 illustrates beam images with different lens values.
Figure 10:
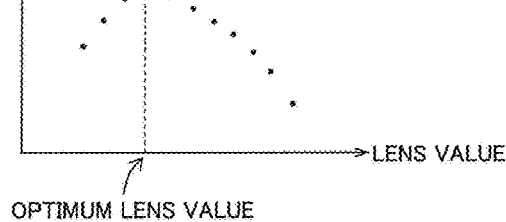
FIG. 10 is a graph showing a relationship between lens value and luminance variance.

The inspection described above is performed for all the plurality of lens values within the preset range (steps S13 to S16). By performing scanning while varying the lens value, a beam image for each lens value, such as that illustrated in FIG. 9, can be obtained. FIG. 10 is a graph showing a relationship between lens value and luminance variance.

The closer the focus position is to the optimum value, the higher the contrast of the beam image and the larger the variance of the luminance. Therefore, the optimum-lensvalue detecting unit 66 detects a value that maximizes the luminance variance as the optimum lens value (step S17). In writing processing, the lens control circuit 36 sets the optimum lens value for the objective lens 16.

The optimum-lens-value detecting unit 66 may perform function fitting on luminance variances obtained in the inspection, and detect a lens value which is the maximum value of the determined function as the optimum lens value.

As described above, in the present embodiment, where a plurality of beams within the measurement region are scanned and electron beams passed through the through hole 42 are sequentially switched, a beam image can be generated in a short time. The lens value of the objective lens 16 is varied to generate beam images at a plurality of focus positions, and an optimum lens value can be determined from luminance variances of the respective beam images in a short time with high accuracy.

The present embodiment does not require cancellation of rotation of the entire multi-beam image, and thus can achieve focusing with a simple operation without having lenses operate in conjunction with each other.

In multiple beams composed of many beams, there is a phenomenon called field curvature in which the optimum focus position varies depending on the beam region. If the optimum lens value is detected for only one measurement region and set, the impact of beam blurring in another region may be increased. Therefore, it is preferable to detect optimum lens values for a plurality of measurement regions and set the median of the plurality of optimum lens values. This can reduce the impact of beam blurring associated with field curvature.

Figure 11:
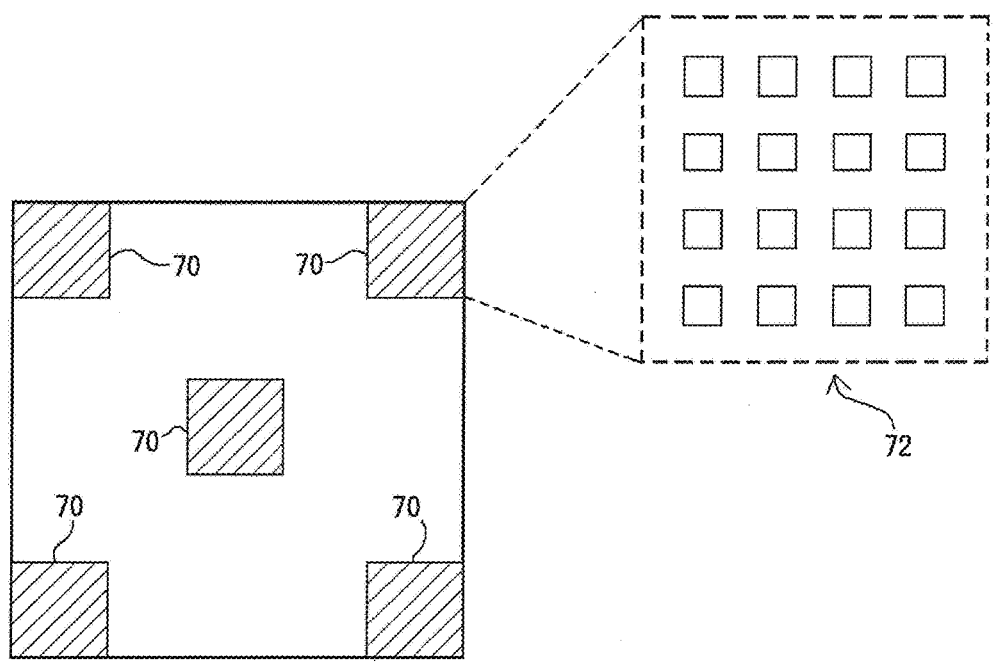
FIG. 11 illustrates a beam group for measuring an optimum lens value.

For example, as illustrated in FIG. 11, five points, including the four corners and the center, of multiple beams are selected as measurement regions 70, and the inspection aperture 40 is scanned with a beam group 72 in each measurement region 70. An optimum lens value of a beam image corresponding to each measurement region 70 is calculated, and the median (or mean value) of the calculated five optimum lens values is determined. In other words, a first optimum focus position corresponding to each measurement region 70 is calculated, the median (or mean value) of the calculated five first optimum focus positions is defined as a second optimum focus position, and then the objective lens 16 is adjusted on the basis of the second optimum focus position.

Figure 12:
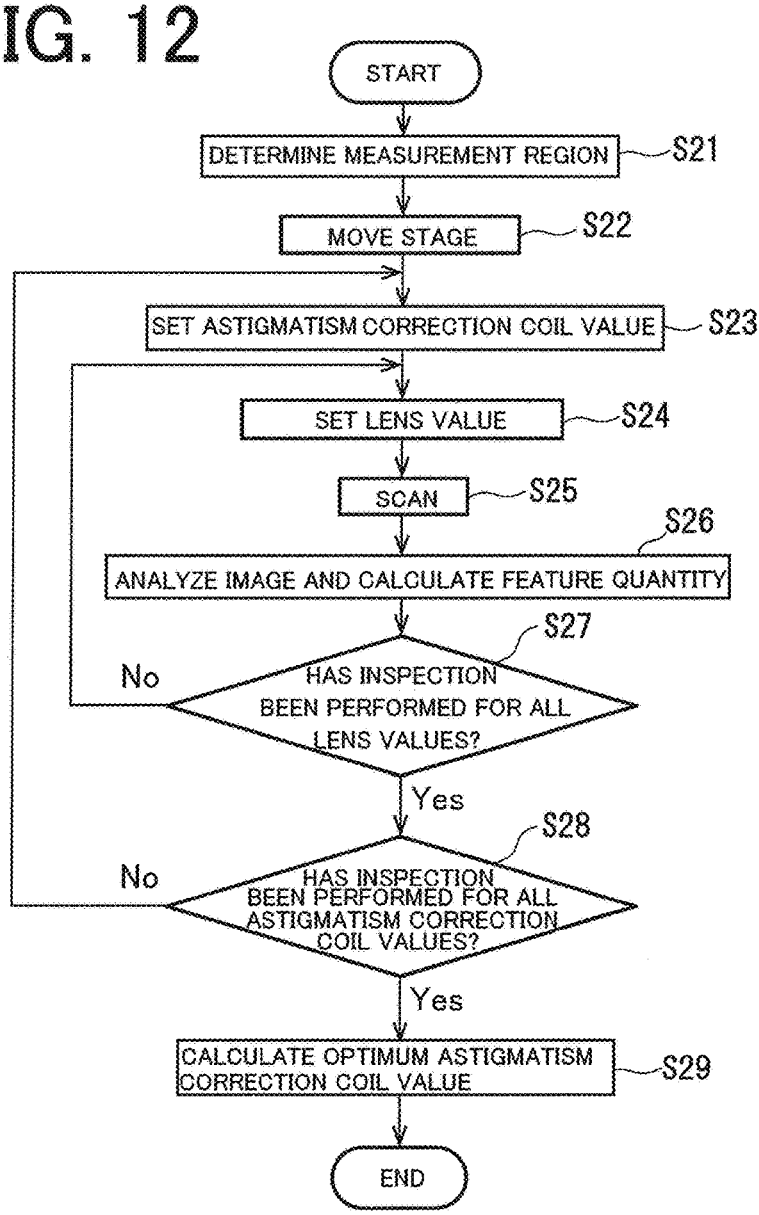
FIG. 12 is a flowchart illustrating an astigmatism adjusting method according to the embodiment.

Next, a technique for adjustment of astigmatism is described using the flowchart of FIG. 12.

First, a measurement region (beam-on region) in the blanking aperture array 10 is determined (step S21). The XY stage 22 is moved to position the inspection aperture 40 such that beams in the measurement region can be applied to the inspection aperture 40 (step S22).

The coil control circuit 38 changes or sets an excitation current value (astigmatism correction coil value) of the astigmatism correction coil 18 that corrects astigmatism (step S23). As described below, any of a plurality of values within a preset range is variably set as the astigmatism correction coil value.

The lens control circuit 36 changes or sets an excitation current value (lens value) of the objective lens 16 (step S24). As described below, any of a plurality of values within a preset range is variably set as the lens value.

A plurality of beams turned on by blankers in the measurement region are deflected by the deflector 17 in the XY direction to scan the inspection aperture 40, and electron beams passed through the through hole 42 are sequentially switched (step S25). The current detector 50 detects a beam current.

The control computer 32 converts the beam current detected by the current detector 50 into luminance, generates a beam image on the basis of the amount of deflection made by the deflector 17, and performs image analysis (step S26). The ellipse fitting unit 65 detects the contour of each beam within the beam image, performs ellipse fitting, and extracts an elliptical (substantially circular) beam shape. Then, the ellipse fitting unit 65 calculates the ratio between the long and short diameters of the ellipse as a feature quantity.

The inspection described above is performed for all the plurality of lens values within the preset range while the astigmatism correction coil value is varied (steps S23 to S28).

The closer the astigmatism correction coil value is to the optimum value, the closer the beam shape is to a perfect circular shape, and also the smaller the ratio between the long and short diameters of the ellipse regardless of the lens value (focus position). That is, the variance of the ratio between the long and short diameters of the ellipse for each astigmatism correction coil value decreases as the astigmatism correction coil value becomes closer to the optimum value. Therefore, the optimum-coil-value detecting unit 67 detects an astigmatism correction coil value that minimizes the variance of the ratio between the long and short diameters of the ellipse as an optimum astigmatism correction coil value (step S29). In writing processing, the coil control circuit 38 sets the optimum astigmatism correction coil value (optimum excitation current value) for the astigmatism correction coil 18.

As described above, in the present embodiment, where a plurality of beams within the measurement region are scanned and electron beams passed through the through hole 42 are sequentially switched, a beam image can be generated in a short time. The astigmatism correction coil value of the astigmatism correction coil 18 and the lens value of the objective lens 16 are varied to generate a plurality of beam images with different astigmatism correction coil values and focus positions. The ratio between the long and short diameters of an individual elliptical beam within each beam image is calculated and, from the variance of the ratio for each astigmatism correction coil value, an optimum astigmatism correction coil value can be determined in a short time with high accuracy.

Instead of the ratio between the long and short diameters of each ellipse, an array pitch of a plurality of ellipses (elliptical array) within a beam image may be determined as a feature quantity. In the beam image, a plurality of ellipses is arranged on two axes orthogonal to each other. The closer the astigmatism correction coil value is to an optimum value, the closer a first pitch on a first axis and a second pitch on a second axis are to each other, and also the smaller the ratio between the first and second pitches regardless of the lens value (focus position). That is, the closer the astigmatism correction coil value is to the optimum value, the smaller the variance of the ratio between the first and second pitches (array pitch) for each astigmatism correction coil value. Therefore, the optimum-coil-value detecting unit 67 detects an astigmatism correction coil value that minimizes the variance of the ratio between the first and second pitches as an optimum value.

In multiple beams composed of many beams, an optimum astigmatism correction coil value may vary depending on the region. If an optimum astigmatism correction coil value is detected for only one measurement region and this astigmatism correction coil value is set, even though there may be beam regions of substantially perfect circular shape, there may be elliptical beam regions with large aspect ratios, and beam shapes may vary significantly among the multiple beams.

Therefore, it is preferable to detect optimum astigmatism correction coil values for a plurality of measurement regions and set the median (or mean value) of the plurality of optimum astigmatism correction coil values. Astigmatism can thus be corrected for all the multiple beams.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam writing apparatus comprising:
    an aperture plate having a plurality of holes and forming multiple beams by allowing a charged particle beam to pass through the plurality of holes;
    a blanking aperture array having a plurality of blankers each configured to turn on and off a corresponding beam of the multiple beams;
    a stage placing a substrate serving as a writing target thereon, the stage being movable in an XY direction;
    an objective lens adjusting a focus position of the multiple beams;
    a coil correcting astigmatism of the multiple beams;
    an inspection aperture disposed in the stage and configured to allow one beam of the multiple beams to pass therethrough;
    a deflector deflecting the multiple beams;
    a current detector detecting a beam current of each beam of the multiple beams scanned over the inspection aperture in the XY direction and passed through the inspection aperture; and
    a control computer generating a beam image on the basis of the detected beam current, calculating a feature quantity of the beam image, and controlling the objective lens or the coil on the basis of the feature quantity,
    wherein the inspection aperture includes a through hole through which the one beam passes, and
    a diameter $\phi 1$ of the through hole satisfies a following condition:

$$S<\phi 1<P-S$$

wherein S is a beam size of the one beam, and P is a beam pitch of the multiple beams on the substrate.

2. The apparatus according to claim 1, wherein the inspection aperture is scanned at a plurality of focus positions; and
    the control computer generates a plurality of beam images corresponding to the plurality of focus positions, calculates a luminance variance of each beam image as the feature quantity, determines a first optimum focus position from the calculated luminance variance and controls the objective lens.

3. The apparatus according to claim 2, wherein the control computer detects a focus position corresponding to a beam image having largest of the luminance variance as the first optimum focus position.

4. The apparatus according to claim 2, wherein the inspection aperture is scanned by sequentially using beams in a plurality of regions in the multiple beams; and
    the control computer determines a plurality of first optimum focus positions corresponding to the plurality of regions, determines a second optimum focus position from the plurality of first optimum focus positions, and controls the objective lens on the basis of the second optimum focus position.

5. The apparatus according to claim 4, wherein the control computer determines a median or mean value of the plurality of first optimum focus positions as the second optimum focus position.

6. The apparatus according to claim 1, wherein the inspection aperture is scanned at a plurality of focus positions and a plurality of excitation current values of the coil; and
    the control computer generates a plurality of beam images corresponding to the plurality of focus positions and the plurality of excitation current values, fits each beam shape within the beam image to an ellipse, calculates a ratio between a long diameter and a short diameter of the ellipse as the feature quantity, determines an optimum excitation current value from a variance of the ratio for each excitation current value, and controls the coil.

7. The apparatus according to claim 6, wherein the inspection aperture is scanned by sequentially using beams in a plurality of regions in the multiple beams; and
    the control computer determines a plurality of optimum excitation current values corresponding to the plurality of regions, and controls the coil on the basis of a median or mean value of the plurality of optimum excitation current values.

8. The apparatus according to claim 1, wherein the inspection aperture is scanned at a plurality of focus positions and a plurality of excitation current values of the coil; and
    the control computer generates a plurality of beam images corresponding to the plurality of focus positions and the plurality of excitation current values, fits a plurality of beam shapes within the beam image to ellipses, calculates an array pitch of the plurality of ellipses on two orthogonal axes as the feature quantity, determines an optimum excitation current value from a variance of the array pitch for each excitation current value, and controls the coil.

9. The apparatus according to claim 8, wherein the inspection aperture is scanned by sequentially using beams in a plurality of regions in the multiple beams; and
    the control computer determines a plurality of optimum excitation current values corresponding to the plurality of regions, and controls the coil on the basis of a median or mean value of the plurality of optimum excitation current values.

10. A charged particle beam writing method comprising:
    emitting a charged particle beam;
    forming multiple beams by allowing the charged particle beam to pass through a plurality of holes of an aperture member;
    turning on and off beams using a plurality of blankers of a blanking aperture array, the beams corresponding to the respective blankers;

scanning the multiple beams over an inspection aperture in an XY direction, the inspection aperture being disposed in a stage and configured to allow one beam of the multiple beams to pass therethrough, the stage placing a substrate serving as a writing target thereon;

detecting a beam current of each beam of the multiple beams passed through the inspection aperture;

generating a beam image on the basis of the detected beam current; and calculating a feature quantity of the beam image and controlling an objective lens or a coil on the basis of the feature quantity, the objective lens being configured to adjust a focus position of the multiple beams, the coil being configured to correct astigmatism of the multiple beams, wherein the inspection aperture includes a through hole through which the one beam passes, and a diameter $\phi 1$ of the through hole satisfies a following condition:

$$S<\phi 1<P-S,$$

wherein S is a beam size of the one beam, and P is a beam pitch of the multiple beams on the substrate.

11. The method according to claim 10, wherein the inspection aperture is scanned at a plurality of focus positions, a plurality of beam images corresponding to the plurality of focus positions are generated, a luminance variance of each beam image is calculated as the feature quantity, and a first optimum focus position is determined based on the luminance variance calculated, and the objective lens is controlled.

12. The method according to claim 11, wherein a focus position corresponding to a beam image having largest of the luminance variance is detected as the first optimum focus position.

13. The method according to claim 11, wherein the inspection aperture is scanned by sequentially using beams in a plurality of regions in the multiple beams, a plurality of first optimum focus positions corresponding to the plurality of regions are determined, and a second optimum focus position is determined from the plurality of first optimum focus positions, and the objective lens is controlled on the basis of the second optimum focus position.

14. The method according to claim 13, wherein a median or mean value of the plurality of first optimum focus positions is determined as the second optimum focus position.

15. The method according to claim 10, wherein the inspection aperture is scanned at a plurality of focus positions and a plurality of excitation current values of the coil, a plurality of beam images corresponding to the plurality of focus positions and the plurality of excitation current values are generated, each beam shape within the beam image is fitted to an ellipse, a ratio between a long diameter and a short diameter of the ellipse is calculated as the feature quantity, and an optimum excitation current value is determined from a variance of the ratio for each excitation current value, and the coil is controlled.

16. The method according to claim 15, wherein the inspection aperture is scanned by sequentially using beams in a plurality of regions in the multiple beams, a plurality of optimum excitation current values corresponding to the plurality of regions are determined, and the coil is controlled on the basis of a median or mean value of the plurality of optimum excitation current values.

17. The method according to claim 10, wherein the inspection aperture is scanned at a plurality of focus positions and a plurality of excitation current values of the coil, a plurality of beam images corresponding to the plurality of focus positions and the plurality of excitation current values are generated, a plurality of beam shapes within the beam image are fitted to ellipses, an array pitch of the plurality of ellipses on two orthogonal axes is calculated as the feature quantity, an optimum excitation current value is determined from a variance of the array pitch for each excitation current value, and the coil is controlled.

18. The method according to claim 17, wherein the inspection aperture is scanned by sequentially using beams in a plurality of regions in the multiple beams, a plurality of optimum excitation current values corresponding to the plurality of regions are determined, and the coil is controlled on the basis of a median or mean value of the plurality of optimum excitation current values.

* * * * *